United States Patent [19]

Blomstedt et al.

[11] Patent Number: 4,685,032
[45] Date of Patent: Aug. 4, 1987

[54] INTEGRATED BACKPLANE

[75] Inventors: John W. Blomstedt, Bedford; Paul S. Yoshida, Newton Highlands; Wesley F. Irving, Braintree; Vladimir Roudenko, Natick, all of Mass.

[73] Assignee: Honeywell Information Systems Inc., Minneapolis, Minn.

[21] Appl. No.: 750,441

[22] Filed: Jul. 1, 1985

[51] Int. Cl.⁴ .............................................. H05K 7/10
[52] U.S. Cl. .................................. 361/412; 361/342; 361/407
[58] Field of Search ........................ 361/389-390, 361/392-395, 399-400, 412-415, 407, 341-342; 339/17 LC, 17 LM, 17 M, 258 R, 258 P, 14 R, 14 P, 117 FF, 117 F; 174/68 B, 70-B, 71

[56] References Cited

U.S. PATENT DOCUMENTS

| | | | |
|---|---|---|---|
| 3,159,447 | 12/1964 | Crimmins et al. | 339/17 F |
| 3,182,276 | 5/1965 | Ruehlemann | 339/17 LC |
| 3,470,421 | 9/1969 | Shore et al. | 361/413 X |
| 3,657,701 | 4/1972 | Garth | 361/412 X |
| 3,689,684 | 9/1972 | Cox, Jr. et al. | 339/17 M X |
| 4,028,794 | 6/1977 | Ritchie et al. | 339/17 M X |
| 4,029,374 | 6/1977 | Nestor et al. | 339/17 LM X |
| 4,080,027 | 4/1978 | Benasutti | 339/75 MP X |
| 4,200,865 | 4/1980 | Morioka et al. | 361/409 X |
| 4,241,381 | 12/1980 | Cobaugh et al. | 361/394 X |
| 4,242,721 | 12/1980 | Krolak et al. | 361/415 |
| 4,249,229 | 1/1981 | Hester | 361/400 X |
| 4,331,839 | 5/1982 | Baumbach | 361/415 X |
| 4,337,499 | 6/1982 | Cronin et al. | 361/415 |
| 4,420,793 | 12/1983 | Strandberg | 361/415 X |
| 4,511,950 | 4/1985 | Bunner et al. | 361/415 X |
| 4,531,793 | 6/1985 | Hochgesang | 339/258 X |
| 4,609,829 | 9/1986 | Milby et al. | 361/407 |

FOREIGN PATENT DOCUMENTS

| | | | |
|---|---|---|---|
| 259661 | 1/1968 | Austria | 339/258 |
| 0154765 | 9/1985 | European Pat. Off. | 361/407 |
| 2041805 | 2/1972 | Fed. Rep. of Germany | 361/415 |
| 2748100 | 5/1979 | Fed. Rep. of Germany | 361/415 |

OTHER PUBLICATIONS

Winnings, C. L., "A Printed—Ckt-Board Connector Family With Up to 48 Contacts . . . ", Proceedings of 30th Ele. Comp., IEEE, 1980 Apr., pp. 332-340.

Primary Examiner—Arthur T. Grimley
Assistant Examiner—Jane K. Lau
Attorney, Agent, or Firm—George Grayson; John S. Solakian

[57] ABSTRACT

An electronic system is packaged to provide a single etched backplane. Bus bars are physically fastened to bushings which are soldered to the backplane power etch lines to provide power to the system.

Printed circuit boards are plugged into connectors mounted on the backplane for receiving power and transferring logic signals between printed circuit boards. A number of power supplies are plugged into connectors mounted on the bus bars for transmitting power, and plugged into connectors for transferring logic signals.

11 Claims, 4 Drawing Figures

ELECTRONIC SYSTEM 1

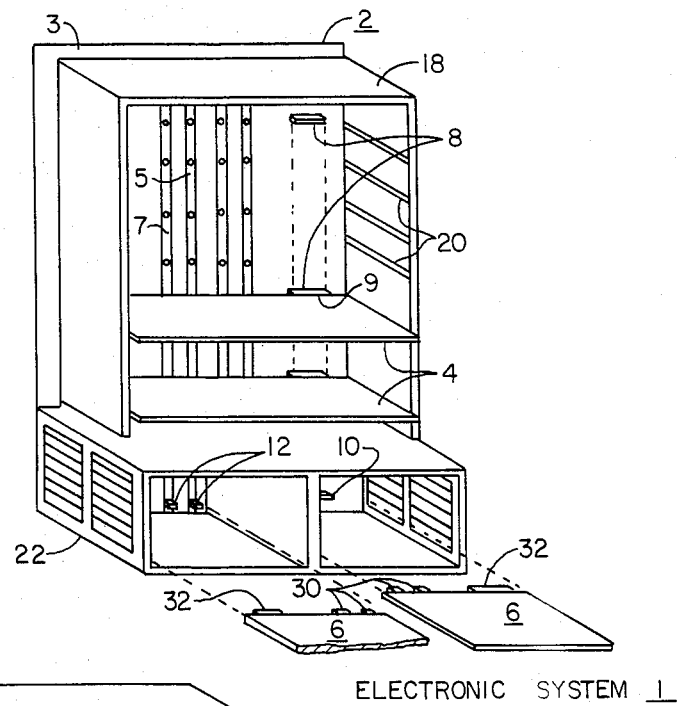
FIG. 1
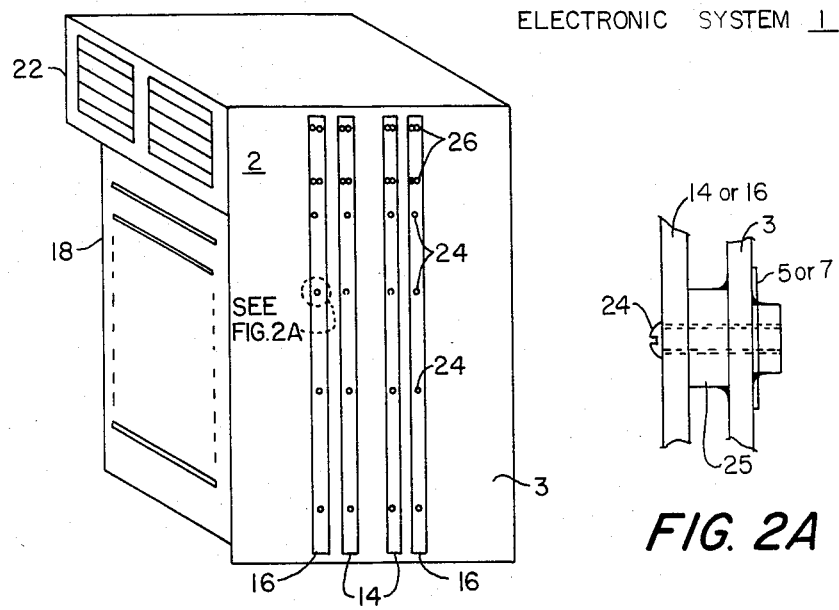
FIG. 2
FIG. 2A

INTEGRATED BACKPLANE

RELATED APPLICATION

The following U.S. patent application filed on an even date with the instant application and assigned to the same assignee as the instant application is related to the instant application and is incorporated herein by reference.

"Power Supply Contact" by John W. Blomstedt, Wesley F. Irving and Mark S. Pusateri, having U.S. Ser. No. 750,431 and filed on July 1, 1985.

BACKGROUND OF THE INVENTION

1. Field of the Invention

This invention relates to the mechanical packaging of electronic assemblies, and more specifically to the use of an integrated backplane into which are plugged both logic boards and power supplies.

2. Description of the Prior Art

Electronic systems, particularly data processing systems, are packaged by having a separate logic backplane having connections mounted in the backplane with selected connector pins coupled together by a copper etch on the surface of the backplane. Separate power supplies are mounted elsewhere in the cabinet and connected to the logic backplane with heavy copper cable which carry high current-low voltage. Also, signal lines between the power supplies and the logic require separate multiconductor cables. This prior art system usually requires a protective enclosure for all power supplies.

Another disadvantage of the prior art design is that power supplies cannot be parallelled for power sharing due to the requirement for multiple sensing. Multiple sensing requires that the power supplies provide control signals to each other as well as to the logic to provide for balanced loading of the power supplies.

The long wire runs add to the electromagnetic interference and radio frequency interference signals.

OBJECTS OF THE INVENTION

Accordingly, it is a primary object of the invention to provide an improved mechanical packaging system.

It is an object of the invention to have an improved system which does not require cables between the power and the logic.

It is also an object of the invention to have an improved system having a minimum voltage drop between the power and the logic.

It is yet another object of the invention to provide for redundant parallel operation of the power supplies.

It is still another object of the invention to provide for short signal lines between the power and the logic.

SUMMARY OF THE INVENTION

An electronic system is packaged with an integrated multilayer backplane. Each of the logic printed circuit boards plugs into their respective connector mounted on the backplane. Multiple power supplies also bring the signal lines to a printed circuit board connector mounted on the power supply which plugs into a mating connector mounted on the backplane.

Voltage and ground are distributed to areas of the backplane by means of bus bars. Special connectors are bolted to the bus bars and mesh with corresponding bus bars mounted on the power supplies.

All printed circuit boards and power supplies are readily pluggable and unpluggable from the single integrated backplane.

BRIEF DESCRIPTION OF THE DRAWINGS

The noel features which are characteristic of the invention are set forth with particularity in the appended claims. The invention itself, however, both as to organization and operation may best be understood by reference to the following description in conjunction with the drawings in which:

FIG. 1 shows a breakout of the assembly of the packaging including the integrated backplane;

FIG. 2(a) and 2(b) show the integrated backplane with the bus bars bolted to it.

DESCRIPTION OF THE PREFERRED EMBODIMENT

Figure 3:
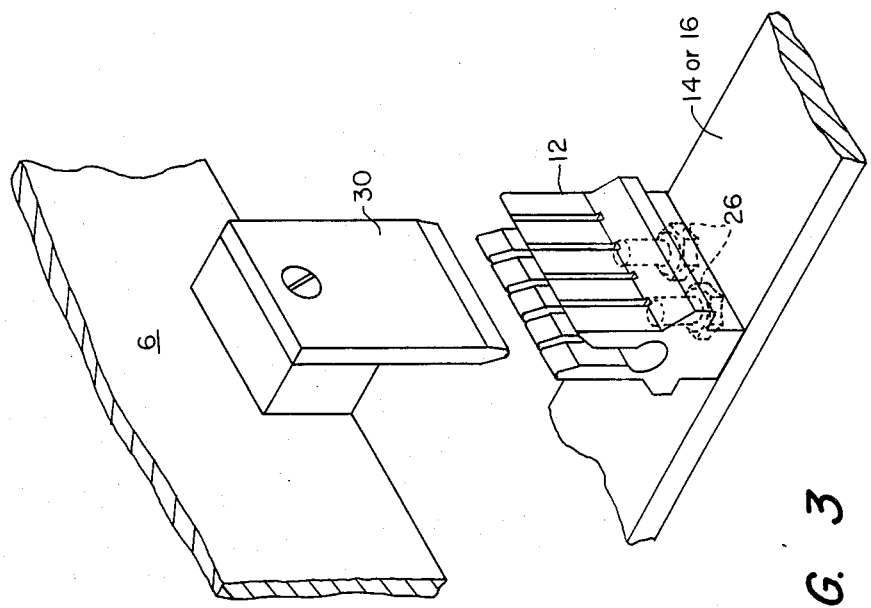
FIG. 3 shows how the power supply plugs into a connctor bolted to the bus bars.

Referring to FIG. 1, an electronic system 1 includes an integrated backplane 2 into which are plugged a number of etched printed circuit board assemblies 4 and typically four power supplies 6, one of which is shown.

The backplane 2 includes a multilayer printed circuit board 3 upon which are mounted a number of connectors 8 into which corresponding printed circuit board assemblies 4 are plugged. Also mounted on board 3 are typically four connectors 10, one for each power supply 6.

The board 3 includes etched signal lines between selected pins of the various connectors 8, etched signal lines between selected pins of the various connectors 10 and etched signal lines between selected pins of connectors 8 and 10. In addition, power is provided to selected pins by means of a ground etch 7 and a voltage distribution etch 5.

The etched lines are not shown in the drawing since their physical makeup and use are well known in the industry.

Electronic system 1 also includes a guide 18 which fastens to backplane 2 and provides lateral support for the board assemblies 4 by means of channels 20. Board assemblies 4 include an edge connector 9 which plugs into the respective connector 8.

An enclosure 22 shields and provides lateral support for the typically four power supplies 6.

FIG. 2 shows an outside bottom view of the backplane 2 showing bus bars 16 which distribute ground and bus bars 14 which distribute voltage. The bus bars 14 and 16 are coupled physically and electrically to board 3 by means of a number of bushings 25. Bushings 25 are soldered as shown in FIG. 2A to the respective ground and voltage etches. Bus bars 14 and 16 are bolted to bushings 25 by bolts 24.

A connector 12 is bolted to each bus bar by two bolts 26.

Each power supply 6 of FIG. 1 includes ground and voltage male connectors 30 which plug into connectors 12 to apply ground and voltage to bus bars 16 and 14, respectively. Also, edge connector 32 plugs into connector 10 to couple the power supply control logic to other power supplies 6 and control logic to selected board assemblies 4 control logic.

FIG. 3 shows the detailed assembly of power connector 12 mounted to bus bars 14 or 16 by means of bolts 26. Male connector 30 is fastened to power supply 6 and plugs into power connector 12.

Having shown and described a preferred embodiment of the invention, those skilled in the art will realize that many variations and modifications may be made to affect the described invention and still be within the scope of the claimed invention. Thus, many of the elements indicated above have may be altered or replaced by different elements which will provide the same result and fall within the spirit of the claimed invention. It is the intention, therefore, to limit the invention only as indicated by the scope of the claims.

What is claimed is:

1. An electronic system having a single backplane comprises:

integrated backplane means including first connector means for transferring power and power control signals, and second connector means for transferring said power, said power control signals and logic signals, said integrated backplane means including bus bar means for distributing said power from said first connector means to said second connector means;

power supply means for providing said power and said power control signals and for receiving said power control signals, said power supply means including third connector means being pluggably coupled and said first connector means for transferring said power and said power control signals for making said system operative;

logic board means including fourth connector means pluggably coupled to said second connector means for receiving said power and for distributing said power control signals and said logic signals;

said integrated backplane means further including first circuit means for transferring said power control signals between said first and second connector means;

said integrated backplane means further including second circuit means for distributing said power from said bus bar means to said second connector means.

2. The electronic system of claim 1 wherein said first connector means further comprises:

a first power connector which receives a portion of said power from said power supply means;

a second power connector which receives a ground portion of said power from said power supply means; and a first power control signal connector for transferring said power control signals between said power supply means and said second connector means.

3. The electronic system of claim 2 wherein said integrated backplane means comprises:

single board means on which are mounted said first power control signal connector and said second connector means.

4. The electronic system of claim 3 wherein said single board means includes said first circuit means for transferring said power control signal between said first power control signal connector and said second connector means.

5. The electronic system of claim 4 wherein said first circuit means are etched lines.

6. The electronic system of claim 4 wherein said bus bar means comprises:

a first bus bar coupled to said first power connector which receives said power portion from said power supply means;

a second bus bar coupled to said second power connector which receives said ground portion from said power supply means; and said first and second bus bars being coupled to said single board means.

7. The electronic system of claim 6 wherein said third connector means comprises:

a third power connector pluggably coupled to said first power connector which transfers said power portion of said power from said power supply means to said first bus bar; and a fourth power connector pluggably coupled to said second power connector which transfers said ground portion of said power to said second bus bar, and a second power control signal connector pluggably coupled to said first power control signal connector which transfers said power control signal between said power supply means and said second connector means.

8. The electronic system of claim 6 wherein said second circuit means comprises:

power means for transferring said power between said first bus bar and said second connector means; and grounding means for transferring said ground signal between said second bus bar and said second connector means.

9. The electronic system of claim 8 wherein said second circuit means are etched areas for distributing said power.

10. The electronic system of claim 8 wherein said second connector means includes at least one logic board connector.

11. The electronic system of claim 10 wherein said logic board means includes at least one logic board being pluggably coupled to said at least one board.

* * * * *